US011164716B2

United States Patent
Motomura et al.

(10) Patent No.: US 11,164,716 B2
(45) Date of Patent: Nov. 2, 2021

(54) CHARGED PARTICLE BEAM DEVICE

(71) Applicants: Hitachi High-Tech Corporation, Tokyo (JP); Japan Fine Ceramics Center, Nagoya (JP)

(72) Inventors: Shunichi Motomura, Tokyo (JP); Tsunenori Nomaguchi, Tokyo (JP); Tadahiro Kawasaki, Nagoya (JP); Takeharu Kato, Nagoya (JP); Ryuji Yoshida, Nagoya (JP)

(73) Assignees: Hitachi High-Tech Corporation, Tokyo (JP); Japan Fine Ceramics Center, Nagoya (JP)

( * ) Notice: Subject to any disclaimer, the term of this patent is extended or adjusted under 35 U.S.C. 154(b) by 0 days.

(21) Appl. No.: 17/040,121

(22) PCT Filed: Mar. 29, 2018

(86) PCT No.: PCT/JP2018/013396
§ 371 (c)(1),
(2) Date: Sep. 22, 2020

(87) PCT Pub. No.: WO2019/186936
PCT Pub. Date: Oct. 3, 2019

(65) Prior Publication Data
US 2021/0027977 A1     Jan. 28, 2021

(51) Int. Cl.
*H01J 37/00*      (2006.01)
*H01J 37/147*    (2006.01)
(Continued)

(52) U.S. Cl.
CPC ........ *H01J 37/1471* (2013.01); *H01J 37/145* (2013.01); *H01J 37/244* (2013.01);
(Continued)

(58) Field of Classification Search
USPC ...................................................... 250/396 R
See application file for complete search history.

(56) References Cited

U.S. PATENT DOCUMENTS 3,857,034 A * 12/1974 Hoppe .................... H01J 37/04
                                                          250/311
7,223,983 B2 * 5/2007 Kawasaki ........... H01J 37/1478
                                                          250/310
(Continued)

FOREIGN PATENT DOCUMENTS

| JP | 7-302564 A | 11/1995 |
|---|---|---|
| JP | 2001-6591 A | 1/2001 |
| WO | WO 2016/174891 A1 | 11/2016 |

OTHER PUBLICATIONS

International Search Report (PCT/ISA/210) issued in PCT Application No. PCT/JP2018/013396 dated Jun. 26, 2018 with English translation (two (2) pages).
(Continued)

*Primary Examiner* — Phillip A Johnston
(74) *Attorney, Agent, or Firm* — Crowell & Moring LLP

(57) ABSTRACT

When using a charged particle beam aperture having a ring shape in a charged particle beam device, the charged particle beam with the highest current density immediately above the optical axis, among the charged particle beams is blocked, so that it is difficult to dispose the charged particle beam aperture at the optimal mounting position. Therefore, in addition to the ring-shaped charged particle beam aperture, a hole-shaped charged particle beam aperture is provided, and it is possible to switch between the case where the ring-shaped charged particle beam aperture is disposed on the optical axis of the charged particle beam and the case where the hole-shaped charged particle beam aperture is disposed on the optical axis of the charged particle beam.

14 Claims, 6 Drawing Sheets

(51) Int. Cl.
H01J 37/145 (2006.01)
H01J 37/244 (2006.01)
(52) U.S. Cl.
CPC .............. H01J 2237/0453 (2013.01); H01J 2237/2448 (2013.01)

(56) References Cited

U.S. PATENT DOCUMENTS

| | | | |
|---|---|---|---|
| 7,504,624 B2 * | 3/2009 | Kawasaki | H01J 37/153 |
| | | | 250/306 |
| 8,017,918 B2 * | 9/2011 | Kimura | H01J 37/26 |
| | | | 250/396 ML |
| 8,471,203 B2 * | 6/2013 | Benner | H01J 37/09 |
| | | | 250/311 |
| 10,229,811 B2 * | 3/2019 | Mizuhara | H01J 37/147 |
| 10,636,621 B2 * | 4/2020 | Hanawa | H01J 37/265 |
| 10,903,038 B2 * | 1/2021 | Ishikawa | H01J 37/265 |
| 2018/0114670 A1 | 4/2018 | Kawasaki et al. | |

OTHER PUBLICATIONS

Japanese-language Written Opinion (PCT/ISA/237) issued in PCT Application No. PCT/JP2018/013396 dated Jun. 26, 2018 (three (3) pages).

Enyama et al., "Method of Improving Image Sharpness for Annular-Illumination Scanning Electron Microscopes", Japanese Journal of Applied Physics, May 27, 2016, vol. 55, No. 06GD02, (five (5) pages).

* cited by examiner

[FIG. 1]
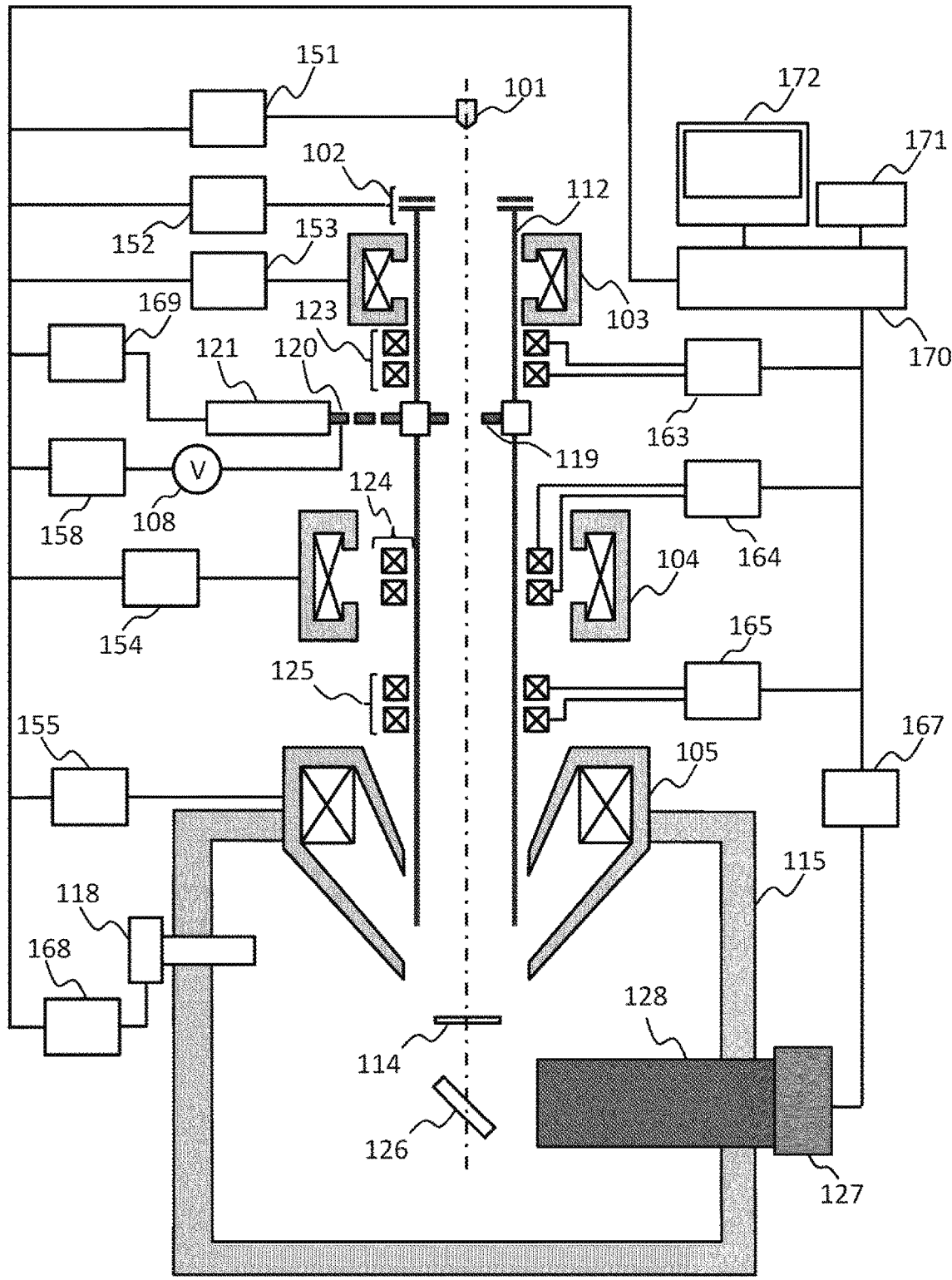

TOP VIEW

CROSS-SECTIONAL VIEW

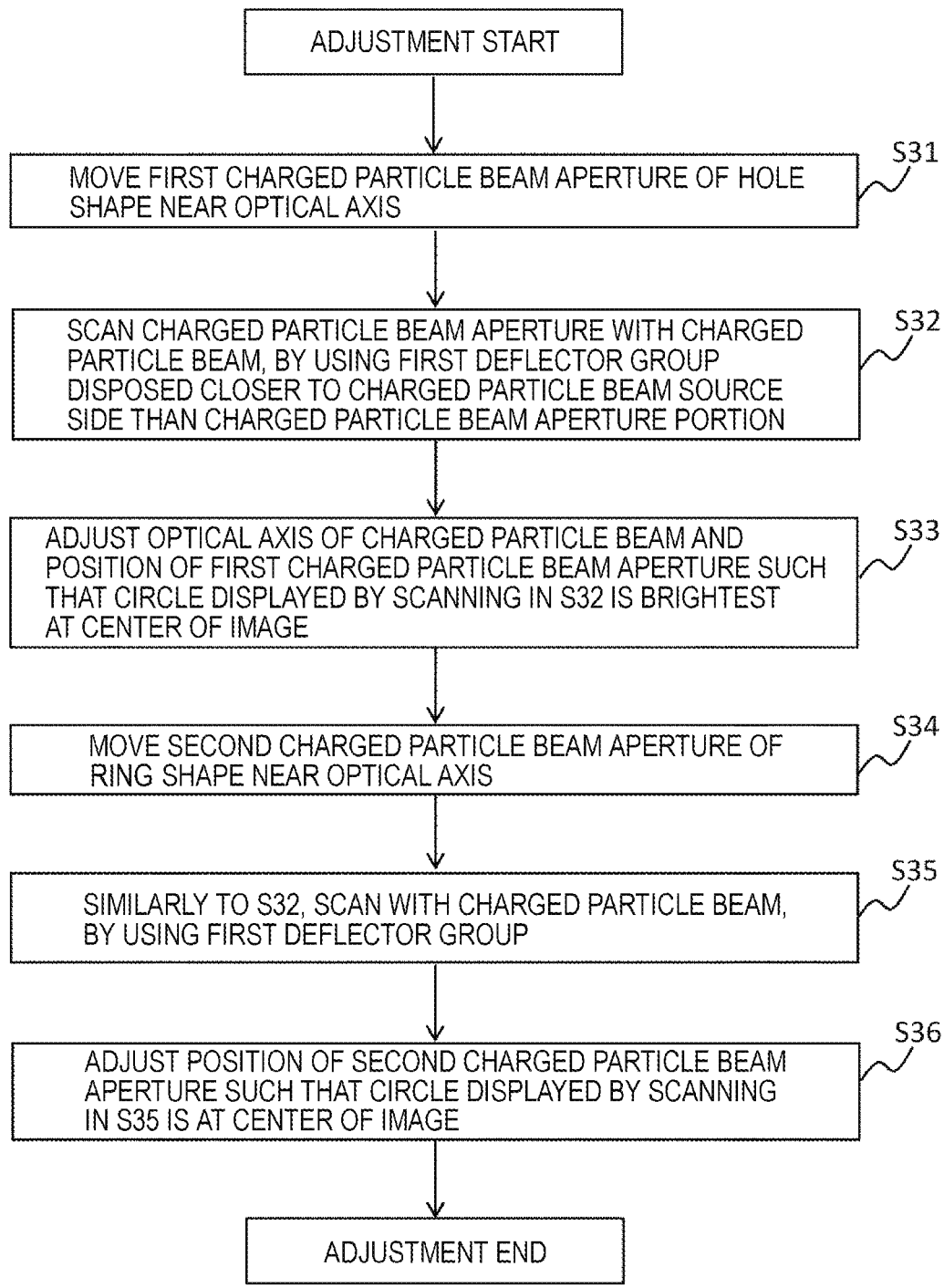

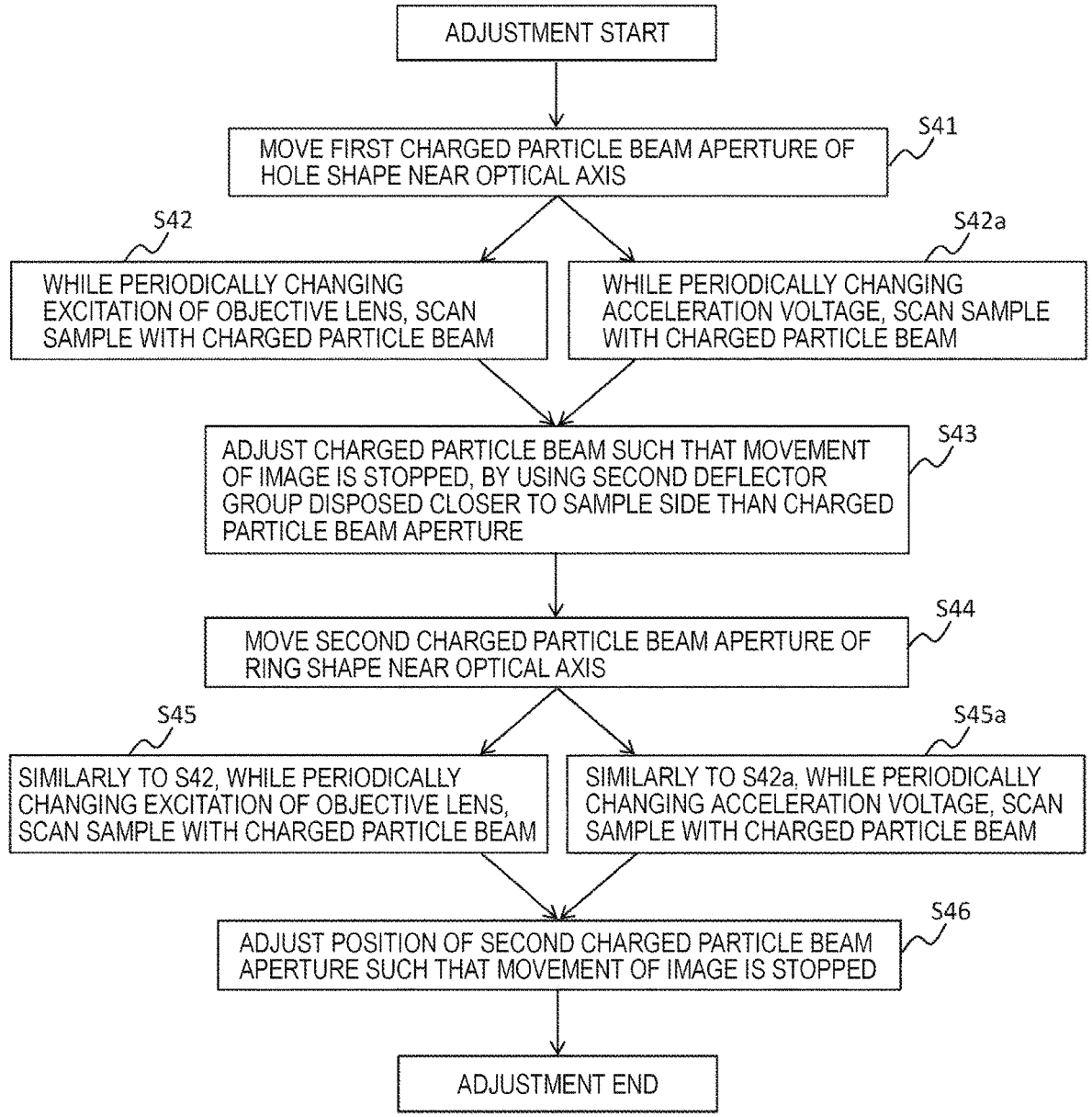
[FIG. 4]

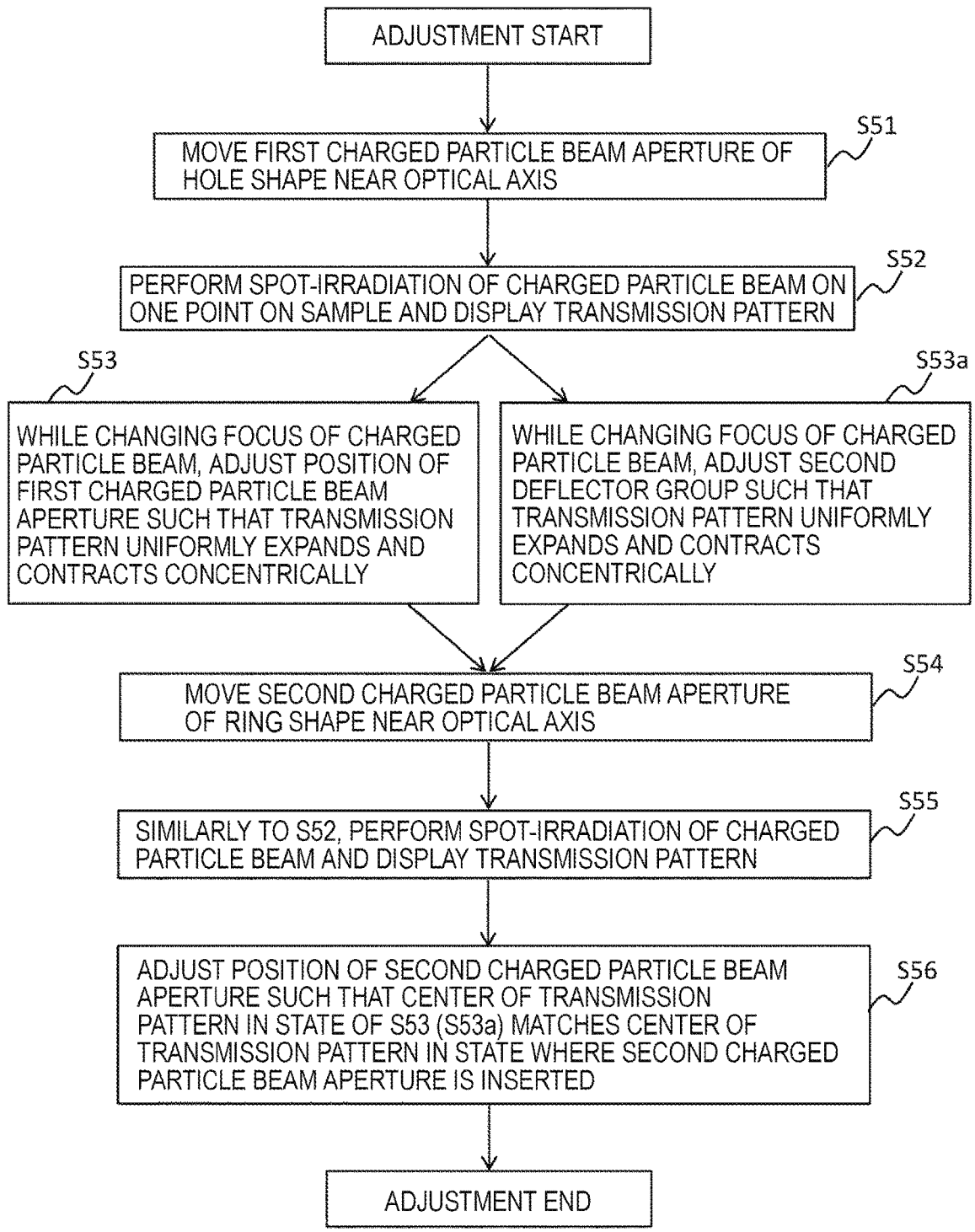

CHARGED PARTICLE BEAM DEVICE

TECHNICAL FIELD

The present invention relates to a charged particle beam device that irradiates a sample with a charged particle beam.

BACKGROUND ART

A charged particle beam device such as a scanning electron microscope (SEM) or a focused ion beam system (FIB) focuses a charged particle beam on a sample to perform nano-level observation, analysis, and processing. These charged particle beam devices are widely used in the fields of semiconductors, materials, and biotechnology, which require nano-level observation, analysis, and processing. Further, in various fields including the semiconductor field in which miniaturization is progressing, further improvement in image resolution and processing accuracy is required.

PTL 1 discloses a spherical aberration corrector that can be realized with a simple structure in which an incident plate and an emission plate are provided, one thereof has a circular opening, and the other has an annular opening, applying a voltage between the incident plate and the emission plate leads to divergence for eliminating positive spherical aberration by an electric field formed in the annular opening. Further, NPL 1 discloses that the depth of focus is improved by using a ring-shaped aperture.

CITATION LIST

Patent Literature

PTL 1: International Publication No. WO 2016/174891

Non Patent Literature

NPL 1: Momoyo Enyama, Koichi Hamada, Muneyuki Fukuda and Hideyuki Kazumi, "Method of improving image sharpness for annular-illumination scanning electron microscopes," Japanese Journal of Applied Physics 55, 06GD02 (2016)

SUMMARY OF INVENTION

Technical Problem

As an aperture of the charged particle beam device, a hole-shaped aperture is generally used, but a ring-shaped aperture has also been known. NPL 1 discloses that the depth of focus is improved by using a ring-shaped aperture. PTL 1 discloses that a spherical aberration correcting effect is obtained by combining a ring-shaped electrode and a hole-shaped electrode and applying a voltage between the two electrodes.

In any case, it is necessary to dispose the center of the ring-shaped aperture or the ring-shaped electrode on the optical axis of the charged particle beam, and the charged particle beam with the highest current density immediately above the optical axis, among the charged particle beams is blocked, Therefore, in the case of an aperture having a hole shape, the aperture can be disposed at an appropriate position by disposing the aperture based on the position where the charged particle beam image becomes the brightest, whereas in the case of a ring-shaped aperture or electrode, the optimal mounting position does not match the position where the charged particle beam image becomes brightest. This makes it difficult to adjust the optimal mounting position of the ring-shaped aperture or electrode.

An object of the present invention is to provide a charged particle beam device that can easily adjust a ring-shaped aperture to an appropriate position.

Solution to Problem

In addition to the ring-shaped charged particle beam aperture, a hole-shaped charged particle beam aperture is provided, and it is possible to switch between the case where the ring-shaped charged particle beam aperture is disposed on the optical axis of the charged particle beam and the case where the hole-shaped charged particle beam aperture is disposed on the optical axis of the charged particle beam.

Advantageous Effects of Invention

A charged particle beam aperture having a ring shape can be appropriately and easily disposed on the optical axis of the charged particle beam.

BRIEF DESCRIPTION OF DRAWINGS

FIG. 1 is a schematic view of a charged particle beam device.

FIG. 3 is a flowchart showing a first adjustment procedure.

FIG. 4 is a flowchart showing a second adjustment procedure.

FIG. 5 is a flowchart showing a third adjustment procedure.

DESCRIPTION OF EMBODIMENTS

Figure 2A:
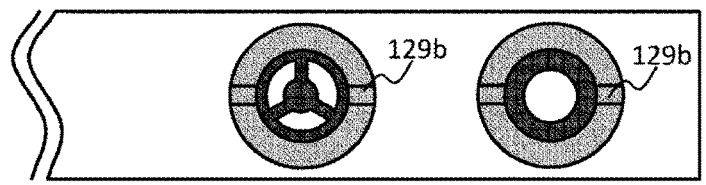
FIGS. 2A and 2B are schematic diagrams showing a configuration of a charged particle beam aperture portion.

An embodiment of the present invention will be described with reference to the drawings. However, the present embodiment is only an example for realizing the present invention. In each drawing, the same reference numerals are given to the same components.

FIG. 1 schematically shows a charged particle beam device. The charged particle beam device includes, as main components, a charged particle beam source 101 that generates a charged particle beam, an acceleration electrode 102 for accelerating the charged particle beam emitted from the charged particle beam source 101, a beam tube 112 disposed from the acceleration electrode 102 to the vicinity of the lower end of the objective lens 105, first and second condenser lenses 103 and 104 that focus the charged particle beam emitted from the charged particle beam source 101, a first charged particle beam aperture 119 having a hole shape that shields a part of charged particles emitted from the charged particle beam source 101, a second charged particle beam aperture 120 having a ring shape that shields a part of the charged particles emitted from the charged particle beam source 101, a charged particle beam aperture device 121 having a drive mechanism for moving the first and second charged particle beam apertures 119 and 120, a charged particle beam aperture power supply 108 that applies a voltage to the second charged particle beam aperture 120, a first deflector group 123 disposed closer to the charged particle beam source 101 than a charged particle beam aperture portion, a second deflector group 124 disposed closer to the sample than the charged particle beam aperture portion, a third deflector group 125 that scans the sample with a charged particle beam, an objective lens 105 that focuses the charged particle beam on the sample, a sample chamber 115 for placing a sample 114, a detector 118 that detects secondary charged particles emitted from the sample, a transmission pattern detection surface 126 for detecting a charged particle beam transmitted through the sample, a camera 127 that observes the pattern on the detection surface, and an optical lens 128 disposed between the detection surface and the camera. Further, controllers that control each component of the above-described charged particle optical system include a charged particle beam source controller 151 that controls the charged particle beam source 101, an accelerating electrode controller 152 that controlling the accelerating electrode 102, first and second condenser lens controllers 153 and 154 that control the first and second condenser lenses 103 and 104, a charged particle beam aperture controller 169 that controls the charged particle beam aperture device 121, a charged particle beam aperture power supply controller 158 that controls the charged particle beam aperture power supply 108, a first deflector group controller 163 that controls the first deflector group 123, a second deflector group controller 164 that controls the second deflector group 124, a third deflector group controller 165 that controls the third deflector group 125, an objective lens controller 155 that controls the objective lens 105, a detector controller 168 that controls the detector 118, and a camera controller 167 that controls the camera 127.

These controllers are controlled by an integrated computer 170 that controls the operation of the entire charged particle beam device and constructs a charged particle beam image. The integrated computer 170 is connected to a controller (a keyboard, a mouse, or the like) 171 and a display 172. The operator inputs various instructions such as irradiation conditions, voltage conditions of the charged particle beam aperture and position conditions from the controller 171, and the acquired image and the control screen can be displayed on the display 172.

In the example of FIG. 1, two condenser lenses 103 and 104 are provided, but the number of condenser lenses is not limited for the purpose of controlling charged particles incident on the objective lens 105. The objective lens 105 is provided with a lens that does not leak a magnetic field outside the magnetic path, but may be a lens that leaks a magnetic field outside the magnetic path, or a compound objective lens having both a type that leaks a magnetic field and a type that does not leak a magnetic field. In addition, the condenser lenses 103 and 104 and the objective lens 105 may be an electrostatic lens for the above-described purpose, or may be an objective lens using both a magnetic lens and an electrostatic lens like a booster optical system or a retarding optical system. There is no limitation on the type of lens for the purpose of focusing the charged particle beam on the sample 114.

When a voltage is not applied to the second charged particle beam aperture 120, the charged particle beam aperture power supply 108 and the charged particle beam aperture power supply controller 158 for controlling the same are not required. Similarly, when the transmission image is not observed, the transmission pattern detection surface 126, the camera 127, the optical lens 128, and the camera controller 167 that controls the camera 127 becomes unnecessary.

In FIG. 1, the beam tube 112 is generally set to a GND potential (reference potential), but a predetermined voltage is applied to the booster optical system. For the purpose of covering the path of the charged particle beam, the shape and the number of constituent members are not limited. Further, the detector 118 that detects the secondary charged particles may be disposed in the sample chamber 115 as shown in FIG. 1, or may be disposed in a column on which the charged particle optical system is mounted. Further, the detector 118 may be disposed both in the sample chamber 115 and the inside of the column. For the purpose of detecting the secondary charged particles, the number of the detectors 118 and the location thereof are not limited. Although FIG. 1 shows a charged particle beam device including one charged particle beam column, a composite charged particle beam device including a plurality of charged particle beam columns may be used.

Figure 2B:
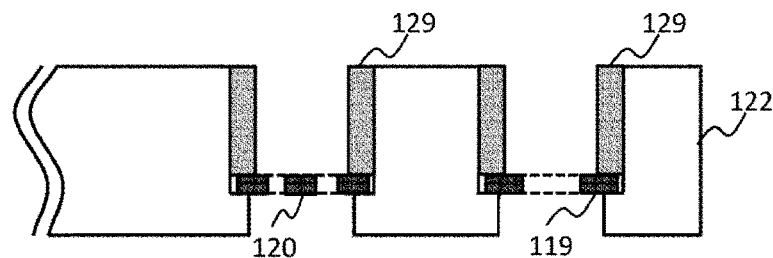

The configuration of the charged particle beam aperture portion will be described with reference to FIGS. 2A to 2E. As shown in FIGS. 2A and 2B, a first charged particle beam aperture 119 having a hole shape and a second charged particle beam aperture 120 having a ring shape are supported by a charged particle stop support base 122. FIG. 2A is a top view, FIG. 2B is a cross-sectional view, and the charged particle beam apertures 119 and 120 are fixed to the support base 122 by the pressure screws 129, respectively. The groove 129b of the thread 129 seen from the top view is provided for screwing the pressure screw 129 into the recess of the support base 122. Modifications of the charged particle beam aperture device are shown below, but the top views are substantially the same, and are omitted.

Figure 2C:
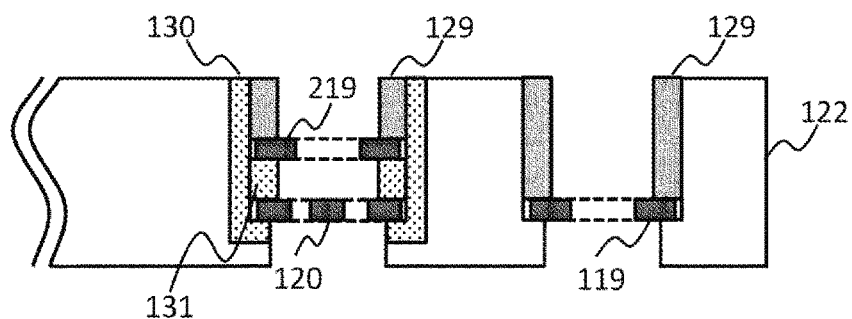
FIG. 2C is a schematic diagram showing a configuration of a charged particle beam aperture portion.

As described in PTL 1, FIG. 2C has an aberration correction function by superimposing the hole-shaped charged particle beam aperture 219 on a ring-shaped charged particle beam aperture 120 along the optical axis direction of the charged particle beam, and applying a voltage between the two stops. In this case, in order to make the ring-shaped charged particle beam aperture 120 and the hole-shaped charged particle beam aperture 219 which are overlapped have different potentials, the two apertures are supported by the support base 122 via the insulating material 130 and the ring-shaped charged particle beam aperture 120 and the hole-shaped charged particle beam aperture 219 are insulated by the insulating spacer 131. In order to generate a voltage between the two apertures, a voltage may be applied to the hole-shaped charged particle beam aperture 219 via the pressure screw 129.

Figure 2D:
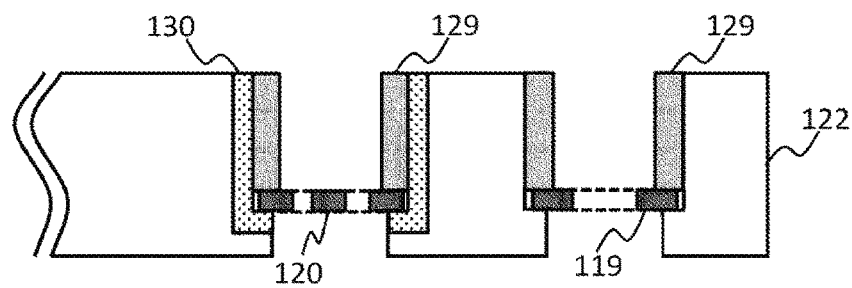
FIG. 2D is a schematic diagram showing a configuration of a charged particle beam aperture portion.

In the example of FIG. 1, the charged particle beam aperture power supply 108 that applies a voltage to the ring-shaped second charged particle aperture 120 is provided, but as illustrated in FIGS. 2A and 2B, the first charged particle beam aperture 119 and the second charged particle beam aperture 120 may be electrically connected to each other via a conductive support base 122, and as illustrated in FIG. 2D, the second charged particle beam aperture 120 may be fixed to the support base 122 via the insulating material 130.

Figure 2E:
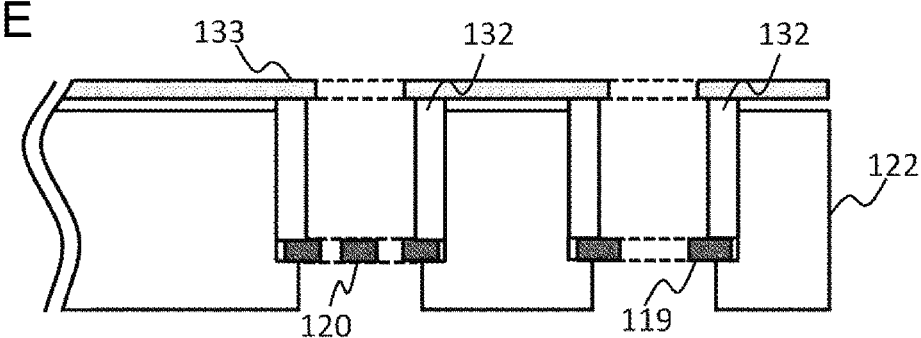
FIG. 2E is a schematic diagram showing a configuration of a charged particle beam aperture portion.

Further, the method of fixing the stop is not limited to the fixing method using the pressure screw 129, and the stop may be fixed by the spacer 132 and the pressing plate 133 as shown in FIG. 2E. The drive mechanism of the charged particle beam aperture device 121 switches between the first charged particle beam aperture 119 and the second charged particle beam aperture 120 by moving the support base 122, and adjusts the position of each aperture. The movement of the support base 122 may be performed by manual driving or electric driving including a stepping motor or a piezo element.

A method for adjusting a charged particle beam aperture having a ring shape will be described. In the present embodiment, first, necessary adjustments to obtain a charged particle beam image including the optical axis adjustment of the charged particle beam is performed on the first charged particle beam aperture 119 having a hole shape. Since the hole shape of the aperture is the general shape of a charged particle beam aperture, this adjustment is an operation normally performed by a user with a general charged particle beam device. Next, the charged particle beam aperture is changed from the first charged particle beam aperture 119 having a hole shape to the second charged particle beam aperture 120 having a ring shape. At this time, the second charged particle beam aperture 120 is disposed based on the position where the hole-shaped first charged particle beam aperture 119 is disposed. Thus, the user can acquire a charged particle beam image using the ring aperture without performing a difficult operation. The specific adjustment procedure will be described below. In these adjustment procedures, each controller of the charged particle optical system is controlled and executed by the integrated computer 170.

(1) First Adjustment Procedure

The first adjustment procedure will be described with reference to FIG. 3. First, the first charged particle beam aperture 119 having a hole shape is moved near the optical axis of the charged particle beam (step 31). The charged particle beam is applied by using the first deflector group 123 disposed closer to the charged particle beam source 101 side than the charged particle beam aperture device (step 32). This corresponds to the scanning the charged particle beam aperture with the charged particle beam.

Therefore, the output of the detector 118 is large (bright) when the hole of the aperture is scanned with the charged particle beam, and the output of the detector 118 is small (dark) when parts other than the hole are scanned with the charged particle beam. Therefore, when an image is displayed based on the scanning position of the charged particle beam, a circular image (charged particle beam image) is displayed. The optical axis of the charged particle beam and the position of the first charged particle beam aperture are adjusted such that the circle displayed by the scanning in step 32 becomes the brightest at the center of the image (observation field of view) (step 33). This corresponds to the position adjustment of the charged particle beam aperture performed in a general charged particle beam device.

Next, the second charged particle beam aperture 120 having a ring shape is moved near the optical axis of the charged particle beam (step 34), and as in step 32, the charged particle beam is applied by using the first deflector group 123 (step 35). On the charged particle beam aperture, the beam diameter of the charged particle beam is wider than the diameter of the charged particle beam aperture, so the image displayed based on the scanning position of the charged particle beam is a circular image (charged particle beam image), regardless of the aperture shape, as in the case of the first charged particle beam aperture. The position of the second charged particle beam aperture is adjusted such that the circle displayed by the scanning in step 35 is at the center of the image (observation field of view) (step 36). In step 33, the optical axis of the charged particle beam is adjusted to pass through the center of the first charged particle beam aperture 119. Therefore, the reason why a circular image (charged particle beam image) displayed when the first charged particle beam aperture is replaced with the second charged particle beam aperture and the charged particle beam is applied by the first deflector group 123 is not at the center of the image (observation field of view) is that the second charged particle beam aperture is not at the position where the first charged particle beam aperture has been located. Therefore, by adjusting the position of the second charged particle beam aperture 120 such that the circular image is brought to the center of the image, the second charged particle beam aperture 120 is adjusted to come to the position where the first charged particle beam aperture 119 has been located. At this time, the circular image that comes to the center is not always the position where the image becomes brightest.

(2) Second Adjustment Procedure

The second adjustment procedure will be described with reference to FIG. 4. In order to adjust the optical axis of the charged particle beam device more accurately than in the first adjustment procedure, after adjusting the charged particle beam aperture having the ring shape in the first adjustment procedure, fine adjustment may be performed in the second adjustment procedure.

First, the first charged particle beam aperture 119 having a hole shape is moved near the optical axis (step 41). The sample is scanned with the charged particle beam by the third deflector group 125 while periodically changing the excitation of the objective lens 105 (step 42). At this time, if the optical axis does not pass through the center of the objective lens 105, the center of the displayed image moves in synchronization with the excitation fluctuation of the objective lens 105. Then, the path of the charged particle beam is adjusted using the second deflector group 124 disposed closer to the sample side than the charged particle beam aperture such that the movement of the image is stopped (step 43). The state in which the movement of the image has stopped corresponds to the charged particle beam passing through the center of the objective lens 105.

Next, the second charged particle beam aperture 120 having a ring shape is moved near the optical axis (step 44). Similarly to step 42, the sample is scanned with the charged particle beam while periodically changing the excitation of the objective lens 105 (step 45) This time, the position of the second charged particle beam aperture 120 is adjusted such that the movement of the image is stopped (step 46). This means that the optical axis of the charged particle beam in a state where the first charged particle beam aperture 119 is inserted is adjusted to pass through the center of the second charged particle beam aperture 120.

In steps 42 and 45 described above, a similar adjustment can be performed, by periodically changing the acceleration voltage of the charged particle beam by the charged particle beam source controller 151, instead of periodically changing the excitation of the objective lens 105 (steps 42*a* and 45*a*).

(3) Third Adjustment Procedure

The third adjustment procedure will be described with reference to FIG. 5. In the third adjustment procedure, adjustment is performed using a transmission pattern. In order to adjust the optical axis of the charged particle beam device more accurately than in the first adjustment procedure, after adjusting the charged particle beam aperture having the ring shape in the first adjustment procedure, fine adjustment may be performed in the third adjustment procedure.

First, the first charged particle beam aperture 119 having a hole shape is moved near the optical axis (step 51). Spot-irradiation of the charged particle beam is performed on one point on the sample, and the transmission pattern is displayed using the transmission pattern detection surface 126 below the sample, the lens 128, and the camera 127 (step 52). In this case, the shape of the transmission pattern is circular.

The pattern displayed in step 52 expands and contracts in conjunction with the excitation fluctuation of the objective lens 105, that is, the change in focus of the charged particle beam. While changing the focus, the position of the first charged particle beam aperture 119 is adjusted such that the transmission pattern uniformly expands and contracts concentrically (step 53). The state in which the change of the pattern is concentrically uniform corresponds to the coincidence of the optical axis of the charged particle beam and the center of the charged particle beam aperture.

Next, the second charged particle beam aperture 120 having a ring shape is moved near the optical axis (step 54). Similar to step 52, spot-irradiation of the charged particle beam is performed on one point on the sample and a transmission pattern is displayed (step 55). In this case, the shape of the transmission pattern is a ring shape. The position of the second charged particle beam aperture 119 is adjusted such that the center of the transmission pattern in the state of step 53 matches the center of the transmission pattern when the second charged particle beam aperture 119 is inserted in step 55 (step 56). This means that the optical axis of the charged particle beam in a state where the first charged particle beam aperture 119 is inserted is adjusted to pass through the center of the second charged particle beam aperture 120.

In step 53 described above, instead of adjusting the position of the first charged particle beam aperture 120, similar adjustment can be performed by adjusting the path of the charged particle beam to make the change of the transmission pattern concentrically uniform, by using the second deflector group 124 disposed closer to the sample side than the charged particle beam aperture portion (step 53a).

The first to third adjustment procedures have been described above. In these adjustment procedures, the aperture may be moved manually, but it is more convenient if the charged particle beam aperture device provided with an electric drive function can be controlled by the controller provided in the charged particle beam device. As one example of realizing the electric drive mechanism, it is conceivable that a large movement such as switching between the first charged particle beam aperture 119 and the second charged particle beam aperture 120 is performed by a stepping motor and the movement requiring fine adjustment accuracy such as adjusting the position of each charged particle beam aperture is performed by a piezo element. Further, a configuration of using a stepping motor or a piezo element for large movement and a stepping motor or a piezo element for fine adjustment may be employed. Alternatively, both large movement and highly accurate movement may be achieved by using a single stepping motor or piezo element. For the purpose of realizing the electric drive mechanism, any means may be used.

Further, the position of the charged particle beam aperture is stored, the position of the charged particle beam aperture is displayed on the display 172, or the position of the second charged particle beam aperture 120 adjusted in advance is stored, the charged particle beam aperture device 121 may set the second charged particle beam aperture 120 in the stored position, only by the user selecting the second charged particle beam aperture. Thereby, the user can easily perform observation or processing using the charged particle beam aperture disposed at the optimal position, and usability can be improved.

REFERENCE SIGNS LIST

101: Charged particle beam source
102: Acceleration electrode
103: First condenser lens
104: Second condenser lens
105: Objective lens
108: Charged particle beam aperture power supply
112: Beam tube
114: Sample
115: Sample chamber
118: Detector
119: First charged particle beam aperture having hole shape
120: Second charged particle beam aperture having ring shape
121: Charged particle beam aperture device
123: First deflector group
124: Second deflector group
125: Third deflector group
126: Transmission pattern detection surface
127: Camera
128: Optical lens
129: Pressure screw
130: Insulation material
131: Insulating spacer
132: Spacer
133: Pressing plate
151: Charged particle source controller
152: Accelerator electrode controller
153: First condenser lens controller
154: Second condenser lens controller
155: Objective lens controller
158: Charged particle beam aperture power controller
163: First deflector group controller
164: Second deflector group controller
165: Third deflector group controller
167: Camera controller
168: Detector controller
169: Charged particle beam aperture controller
170: Integrated computer
171: Controller
172: Display

The invention claimed is:

1. A charged particle beam device comprising:
a charged particle beam source for generating a charged particle beam;
a first charged particle beam aperture having a hole shape;
a second charged particle beam aperture having a ring shape;
a charged particle beam aperture device that moves the first charged particle beam aperture and the second charged particle beam aperture;
a first deflector group disposed between the charged particle beam source and the first charged particle beam aperture or the second charged particle beam aperture;
an objective lens that focuses the charged particle beam on a sample;
a detector that detects secondary charged particles emitted by irradiating the sample with the charged particle beam; and
a computer that forms a charged particle beam image based on the secondary charged particles detected by the detector,
wherein after setting the optical axis of the charged particle beam and the position of the first charged particle beam aperture such that the circular charged particle beam image obtained by scanning the first charged particle beam aperture with the charged particle beam by the first deflector group is brightest at the center of the image, the first charged particle beam aperture is switched to the second charged particle beam aperture, and the position of the switched second charged particle beam aperture is set such that a circular charged particle beam image obtained by scanning the second charged particle beam aperture with the charged particle beam by the first deflector group is at the center of the image.

2. The charged particle beam device according to claim 1, further comprising:
a charged particle beam aperture power supply that applies a voltage to the second charged particle beam aperture.

3. The charged particle beam device according to claim 2, wherein in the second charged particle beam aperture, a charged particle beam aperture having a ring shape and a charged particle beam aperture having a hole shape are superimposed in the optical axis direction of the charged particle beam, and a voltage is applied between the charged particle beam aperture having the ring shape and the charged particle beam aperture having the hole shape by the charged particle beam aperture power supply.

4. The charged particle beam device according to claim 1, wherein a position where the second charged particle beam aperture is set is stored, and when the second charged particle beam aperture is selected, the second charged particle beam aperture is moved to the set position by the charged particle beam aperture device.

5. A charged particle beam device comprising:
a charged particle beam source for generating a charged particle beam;
an objective lens that focuses the charged particle beam on a sample;
a first charged particle beam aperture having a hole shape;
a second charged particle beam aperture having a ring shape;
a charged particle beam aperture device that moves the first charged particle beam aperture and the second charged particle beam aperture;
a second deflector group and a third deflector group which are disposed between the objective lens and the first charged particle beam aperture or the second charged particle beam aperture;
a detector that detects secondary charged particles emitted by irradiating the sample with the charged particle beam; and
a computer that forms a charged particle beam image based on the secondary charged particles detected by the detector,
wherein after a path of the charged particle beam is adjusted by the second deflector group such that movement of the image synchronized with the periodic changing of the excitation of the objective lens is stopped in a charged particle beam image obtained by scanning the sample with the charged particle beam by the third deflector group while periodically changing the excitation of the objective lens, switching is performed from the first charged particle beam aperture to the second charged particle beam aperture, and the position of the switched second charged particle beam aperture is set such that the movement of the image synchronized with the periodic changing of the excitation of the objective lens is stopped in a charged particle beam image obtained by scanning the sample with the charged particle beam by the third deflector group while periodically changing the excitation of the objective lens.

6. The charged particle beam device according to claim 5, wherein a position of the second charged particle beam aperture is set, based on the movement of the image in the charged particle beam image synchronized with the periodic fluctuation of an acceleration voltage caused by periodically changing the acceleration voltage of the charged particle beam source, instead of the movement of the image in the charged particle beam image synchronized with the periodic fluctuation of the excitation of the objective lens caused by periodically changing the excitation of the objective lens.

7. The charged particle beam device according to claim 5, further comprising:
a charged particle beam aperture power supply that applies a voltage to the second charged particle beam aperture.

8. The charged particle beam device according to claim 7, wherein in the second charged particle beam aperture, a charged particle beam aperture having a ring shape and a charged particle beam aperture having a hole shape are superimposed in the optical axis direction of the charged particle beam, and a voltage is applied between the charged particle beam aperture having the ring shape and the charged particle beam aperture having the hole shape by the charged particle beam aperture power supply.

9. The charged particle beam device according to claim 5, wherein a position where the second charged particle beam aperture is set is stored, and when the second charged particle beam aperture is selected, the second charged particle beam aperture is moved to the set position by the charged particle beam aperture device.

10. A charged particle beam device comprising:
a charged particle beam source for generating a charged particle beam;
an objective lens that focuses the charged particle beam on a sample;
a first charged particle beam aperture having a hole shape;
a second charged particle beam aperture having a ring shape;
a charged particle beam aperture device that moves the first charged particle beam aperture and the second charged particle beam aperture;
a second deflector group disposed between the objective lens and the first charged particle beam aperture or the second charged particle beam aperture;
a transmission pattern detection surface for detecting the charged particle beam transmitted through the sample; and
a camera that observes the pattern of the transmission pattern detection surface, wherein
wherein after a position of the first charged particle beam aperture is adjusted such that a transmission pattern obtained by spot-irradiation of the sample with the charged particle beam while periodically changing the excitation of the objective lens uniformly expands and contracts concentrically in synchronization with the periodic fluctuation of the excitation of the objective lens, switching is performed from the first charged particle beam aperture to the second charged particle beam aperture, and the position of the switched second charged particle beam aperture is set such that a center of the transmission pattern in a state where the position of the first charged particle beam aperture is adjusted matches a center of a transmission pattern which is detected by the charged particle beam that has passed through the switched second charged particle beam aperture transmitting through the sample.

11. The charged particle beam device according to claim 10,
   wherein the path of the charged particle beam is adjusted by the second deflector group, instead of adjusting the position of the first charged particle beam aperture.

12. The charged particle beam device according to claim 10, further comprising:
   a charged particle beam aperture power supply that applies a voltage to the second charged particle beam aperture.

13. The charged particle beam device according to claim 12,
   wherein in the second charged particle beam aperture, a charged particle beam aperture having a ring shape and a charged particle beam aperture having a hole shape are superimposed in the optical axis direction of the charged particle beam, and a voltage is applied between the charged particle beam aperture having the ring shape and the charged particle beam aperture having the hole shape by the charged particle beam aperture power supply.

14. The charged particle beam device according to claim 10,
   wherein a position where the second charged particle beam aperture is set is stored, and when the second charged particle beam aperture is selected, the second charged particle beam aperture is moved to the set position by the charged particle beam aperture device.

* * * * *